US009793379B2

(12) United States Patent
Basker et al.

(10) Patent No.: US 9,793,379 B2
(45) Date of Patent: Oct. 17, 2017

(54) FINFET SPACER WITHOUT SUBSTRATE GOUGING OR SPACER FOOT

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Los Altos, CA (US); Raghavasimhan Sreenivasan, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/568,287

(22) Filed: Dec. 12, 2014

(65) Prior Publication Data

US 2016/0172460 A1 Jun. 16, 2016

(51) Int. Cl.
*H01L 29/66* (2006.01)
*H01L 21/8234* (2006.01)

(52) U.S. Cl.
CPC ......... *H01L 29/66795* (2013.01); *H01L 21/823431* (2013.01)

(58) Field of Classification Search
CPC ..... H01L 21/823431; H01L 21/823821; H01L 21/845
See application file for complete search history.

(56) References Cited

U.S. PATENT DOCUMENTS

| 6,924,178 | B2 | 8/2005 | Beintner |
| 7,098,477 | B2 * | 8/2006 | Zhu ............. H01L 21/845 257/66 |
| 7,399,664 | B1 | 7/2008 | Anderson et al. |
| 7,476,578 | B1 | 1/2009 | Cheng et al. |
| 7,488,650 | B2 | 2/2009 | Schulz |
| 7,646,070 | B2 | 1/2010 | Anderson et al. |
| 7,968,930 | B2 | 6/2011 | Aritome |
| 8,174,055 | B2 | 5/2012 | Bonser et al. |
| 8,525,234 | B2 | 9/2013 | Bonser et al. |
| 2006/0154423 | A1 | 7/2006 | Fried et al. |
| 2011/0101455 | A1 * | 5/2011 | Basker ......... H01L 21/26586 257/347 |
| 2013/0020642 | A1 | 1/2013 | Basker et al. |
| 2013/0264617 | A1 | 10/2013 | Joshi et al. |
| 2015/0325445 | A1 * | 11/2015 | Shu ............. H01L 21/28238 438/595 |

* cited by examiner

*Primary Examiner* — Yu-Hsi D Sun
(74) *Attorney, Agent, or Firm* — Steven J. Meyers; Daniel M. Cohn; Howard M. Cohn

(57) ABSTRACT

The present invention relates generally to semiconductor devices, and more particularly, to a structure and method of forming a spacer adjacent to a gate in a fin field effect transistor (FinFET) device without resulting in substrate gouging or a spacer foot. A conformal spacer layer may be formed around a plurality of fins and a gate, wherein the conformal spacer layer may have a thickness above the plurality of fins that is at least one-half the distance between the individual fins. An isotropic etch may be used to remove excess spacer material around the plurality of fins (but not between the fins) and around the gate. An anisotropic etch may be used to remove the remaining spacer material from between the fins and around the gate, leaving a spacer adjacent to the gate without gouging the substrate surface between the fins.

15 Claims, 9 Drawing Sheets

FINFET SPACER WITHOUT SUBSTRATE GOUGING OR SPACER FOOT

BACKGROUND

The present invention relates generally to semiconductor devices, and more particularly, to a structure and method for forming one or more spacers in field effect transistor devices without causing insulation gouging or a spacer foot.

A fin field effect transistor (FinFET) provides solutions to metal-oxide-semiconductor field effect transistor (MOSFET) scaling problems at and below, for example, the 22 nm node of semiconductor technology. A FinFET comprises at least one narrow semiconductor fin gated on at least two sides. FinFET structures have conventionally been formed in either a semiconductor on insulator (SOI) substrate or a bulk semiconductor substrate.

A spacer may be formed adjacent to a gate of a FinFET. In a conventional spacer formation process, spacer material may be deposited on a sidewall of a gate and a sidewall of a fin. Some of the spacer material may then be removed from the sidewall of the fin while leaving the spacer on the sidewall of the gate. Typically, this process requires the gate to be substantially taller than the fin so that spacer material may be "pulled down" from the fin sidewalls by a directional etch without completely removing the spacer material from a sidewall of the gate.

However, the spacer pulldown process may result in significant gouging into an underlying substrate between fins. Gouging into the underlying substrate may lead to undesirable defects in a FinFET device, including mechanical instability of the fins, electrical shorting to the substrate, epitaxial defects in a source-drain, and additional parasitic capacitance between the source-drain and the channel. Gouging into an underlying substrate may be reduced by decreasing spacer pulldown, but this may result in residual spacer material left on fin sidewalls. Spacer material residue on fin sidewalls may cause issues in the subsequent fabrication processes such as source-drain epitaxy on the fin sidewalls.

SUMMARY

According to an embodiment, a method is disclosed. The method may include: forming a spacer layer on an upper surface of a substrate and around a gate and the fins, wherein the spacer layer has a thickness above an upper surface of the fins that is at least approximately one-half of a distance between the fins; and removing a portion of the spacer layer using an anisotropic etch, wherein a portion of the spacer layer remains on sidewalls of the gate as a gate spacer, and wherein the upper surface of the substrate between the fins remains substantially flush with a bottom surface of the fins.

According to another embodiment, a method is disclosed. The method may include: forming fins on an upper surface of a substrate; forming a gate around the fins, wherein the gate is orthogonal to a length of the fins; forming a conformal spacer layer on the upper surface of the substrate and around the fins and the gate, the conformal spacer layer having a thickness above an upper surface of the fins that is at least approximately one-half of a distance between the fins; and removing a portion of the spacer layer using an anisotropic etch, wherein a portion of the conformal spacer layer remains on sidewalls of the gate as a gate spacer, and wherein the upper surface of the substrate between the fins remains substantially flush with a bottom surface of the fins.

According to another embodiment, a structure is disclosed. The structure may include: fins on an upper surface of a substrate, wherein a first portion of the upper surface of the substrate between the fins is substantially flush with a bottom surface of the fins, and wherein a second portion of the upper surface of the substrate adjacent to the fins is below the bottom surface of the fins; a gate around the fins, wherein the gate is on the upper surface of the substrate and orthogonal to a length of the fins; and a gate spacer on a sidewall of the gate and around only a portion of the fins closest to the gate.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

Figure 1:
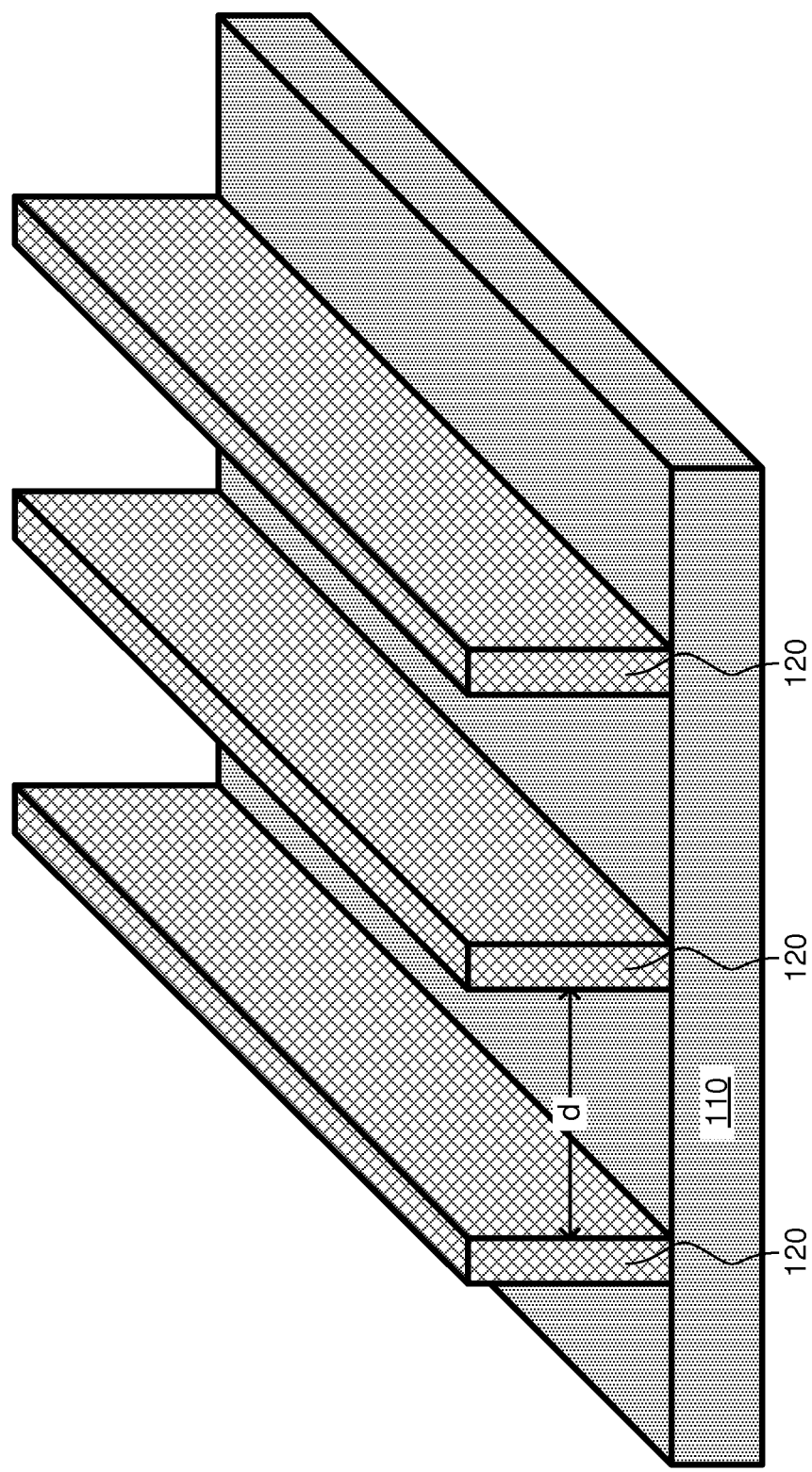
FIG. 1 is an isometric view illustrating forming a plurality of fins above a substrate, according to an embodiment of the invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

For purposes of the description hereinafter, terms such as "spacer foot", "spacer residual", and derivatives thereof refer to spacer material remaining, typically on a side or a base of a fin, after formation of a spacer adjacent to a gate.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor devices and more particularly, to a structure and method of forming a spacer adjacent to a side of a gate in a fin field effect transistor (FinFET) device, while reducing gouging of the underlying insulating layer and significant spacer residue on the fins (e.g. a spacer foot).

Referring to FIG. 1, an isometric view illustrating forming a plurality of fins 120 (hereinafter "fins") on a substrate 110 is shown. The fins 120 may have a width ranging from approximately 2 nm to approximately 40 nm. In a preferred embodiment, the fins 120 may have a width ranging from approximately 4 nm to approximately 20 nm. The fins 120 may have a height ranging from approximately 5 nm to approximately 300 nm. In a preferred embodiment, the fins 120 may have a height ranging from approximately 10 nm to approximately 80 nm. The fins 120 may be separated by a distance d ranging from approximately 5 nm to approximately 100 nm. In a preferred embodiment, the fins 120 may be separated by a distance d ranging from approximately 15 nm to approximately 60 nm. The fins 120 may be formed, for example, by removing material from the substrate 110 using a photolithography process followed by an anisotropic etching process such as reactive ion etching (RIE) or plasma etching. Other methods of forming fins known in the art may also be utilized, such as sidewall image transfer (SIT).

In some embodiments, the substrate 110 may be either a bulk substrate or a semiconductor on insulator (SOI) substrate. In embodiments where the substrate 110 is a bulk substrate, the material of the fins 120 may be the same as the substrate 110 and there may be no identifiable boundary between the fins 120 and the substrate 110. Alternatively, in some embodiments, the material of the fins 120 may be different from the substrate 110. For example, the fins 120 may be made of silicon germanium, and the substrate 110 may comprise silicon. The substrate 110 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide.

In embodiments where the substrate 110 is a SOI substrate, the fins 120 may be formed from a top semiconductor layer separated from a base semiconductor substrate by a buried insulator layer. In such embodiments, the top semiconductor layer and the base semiconductor substrate may be made of the same or different semiconductor materials as the bulk substrate discussed above. The buried insulator layer may have a thickness ranging from approximately 10 to approximately 500 nm. In a preferred embodiment, the buried insulator layer may have a thickness ranging from approximately 50 nm to approximately 200 nm. In such embodiments, the fins 120 may rest on the buried insulator layer, separated from the base semiconductor substrate. The buried insulating layer may be comprised of an insulating material, such as, for example, silicon oxide, silicon nitride, oxynitride, high-k dielectric material, low-k dielectric material, or a combination of insulating materials.

Figure 2:
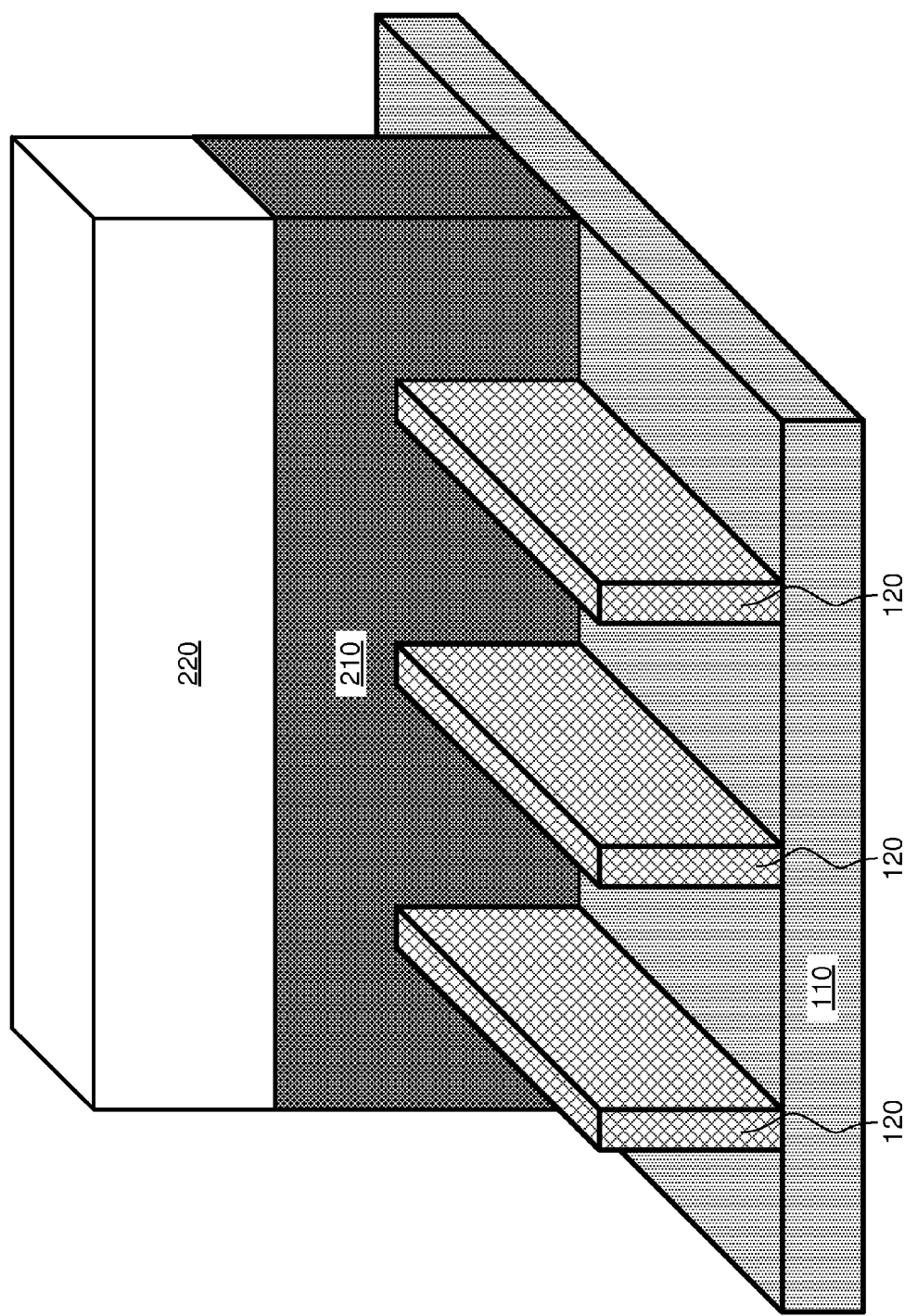
FIG. 2 is an isometric view illustrating forming a gate over a middle portion of the plurality of fins, according to an embodiment of the present invention.

Referring to FIG. 2, a gate 210 may be formed over a portion of the fins 120, typically a center portion as depicted, and a hardmask 220 may be formed over the gate 210. The gate 210 may be formed perpendicularly (i.e. orthogonally) to a length of the fins 120. The gate 210 may have a height of approximately 40 nm to approximately 200 nm, preferably approximately 50 nm to approximately 150 nm. In an embodiment, the gate 210 may include a gate dielectric layer (not shown) and a gate electrode on the gate dielectric layer. The gate 210 may be formed via any known process in the art, including a gate-first process and a gate-last process.

In a gate-first process, the gate dielectric layer may include any suitable insulating material including, but not limited to: oxides, nitrides, oxynitrides or silicates including metal silicates and nitrided metal silicates. In one embodiment, the gate dielectric may include a high-k oxide such as, for example, silicon oxide ($Si_xO_y$), hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The gate dielectric layer may be deposited over the fins 120 using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating.

In a gate-last process, the gate 210 may include a sacrificial gate that may be later removed and replaced by a gate dielectric layer and a gate electrode such as those of the gate-first process described above. In an exemplary embodiment, the sacrificial gate may be made of a polysilicon material with a sacrificial dielectric material (e.g., silicon oxide) formed using known deposition techniques known in the art, including, for example, ALD, CVD, PVD, MBD, PLD, LSMCD, sputtering, and plating. Other suitable materials and methods of forming a sacrificial gate are known in the art.

In an embodiment, a hardmask 220 may be formed on the gate 210. The hardmask 220 may consist of one or more layers comprised of an insulating material, such as, for example, silicon oxide, silicon oxynitride, or a combination of insulating materials. In a preferred embodiment, the hardmask 220 may be comprised of silicon nitride. The hardmask 220 may have a height ranging from approximately 5 nm to approximately 300 nm. In a preferred embodiment, the hardmask 220 may have a greater height than the fins 120. The hardmask 220 may be formed using a deposition technique known in the art, including, for example, ALD, CVD, PVD, MBD, PLD, LSMCD, sputtering, and plating. The hardmask 220 can be patterned during the gate patterning, resulting in the structure shown in FIG. 2. While only a single gate 210 is shown, some embodiments may include more than one gate above the fins 120.

Figure 3:
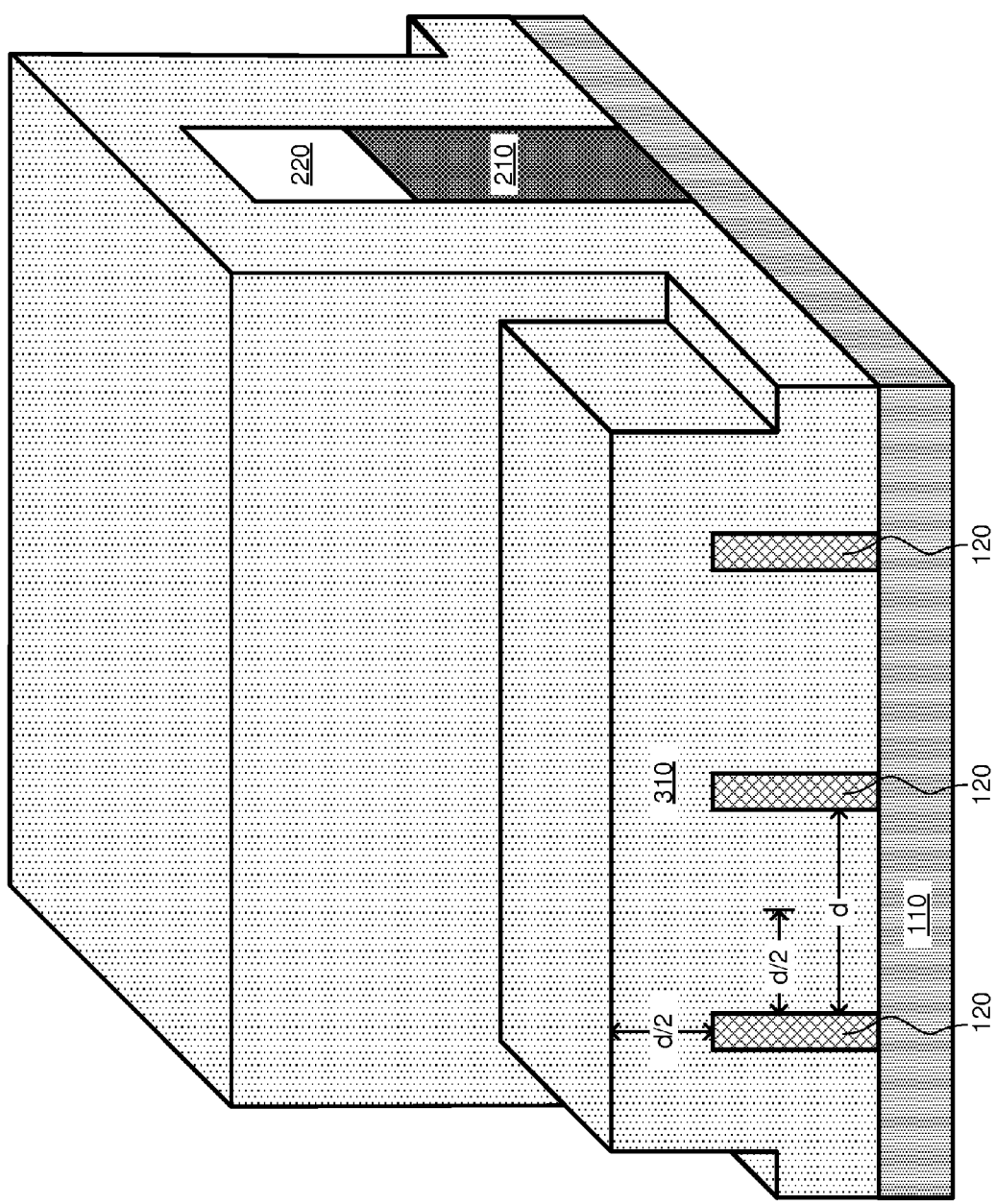
FIG. 3 is an isometric view illustrating forming a conformal spacer layer over the gate and the plurality of fins, according to an embodiment of the present invention.

Referring to FIG. 3, a conformal spacer layer 310 may be deposited over the substrate 110, the hardmask 220, sidewalls of the gate 210, and the fins 120. In an embodiment, the conformal spacer layer 310 may completely fill the regions between the individual fins 120. In order to fill the spaces between the fins 120, the conformal spacer layer 310 may have a thickness above an upper surface of the fins 120 that is equal to or greater than one-half of the distance d separating the fins 120. In one example, where the fins are separated by a distance d of 30 nm, the conformal spacer layer 310 may have a thickness d/2 of at least 15 nm. The conformal spacer layer 310 may be comprised of a dielectric material, such as, for example, silicon nitride, silicon oxide, silicon oxynitride, SiBCN, SiOCN, or a combination of dielectric materials. The conformal spacer layer 310 may be formed using a thin film deposition method, such as, for example, ALD, CVD, PVD, MBD, PLD, LSMCD, plating, or spin-on deposition.

In an embodiment with more than one gate (not shown), the space between one gate and an adjacent gate may be greater than the space between one fin and an adjacent fin. The thickness d/2 of the conformal spacer layer 310 may be greater than one-half the distance between one fin and an adjacent fin but less than half of the distance between one gate and an adjacent gate. Thus, after deposition of spacer material, the spacer material between fins 120 completely fills the space between fins 120 but partially fills the space between gates.

Figure 4A:
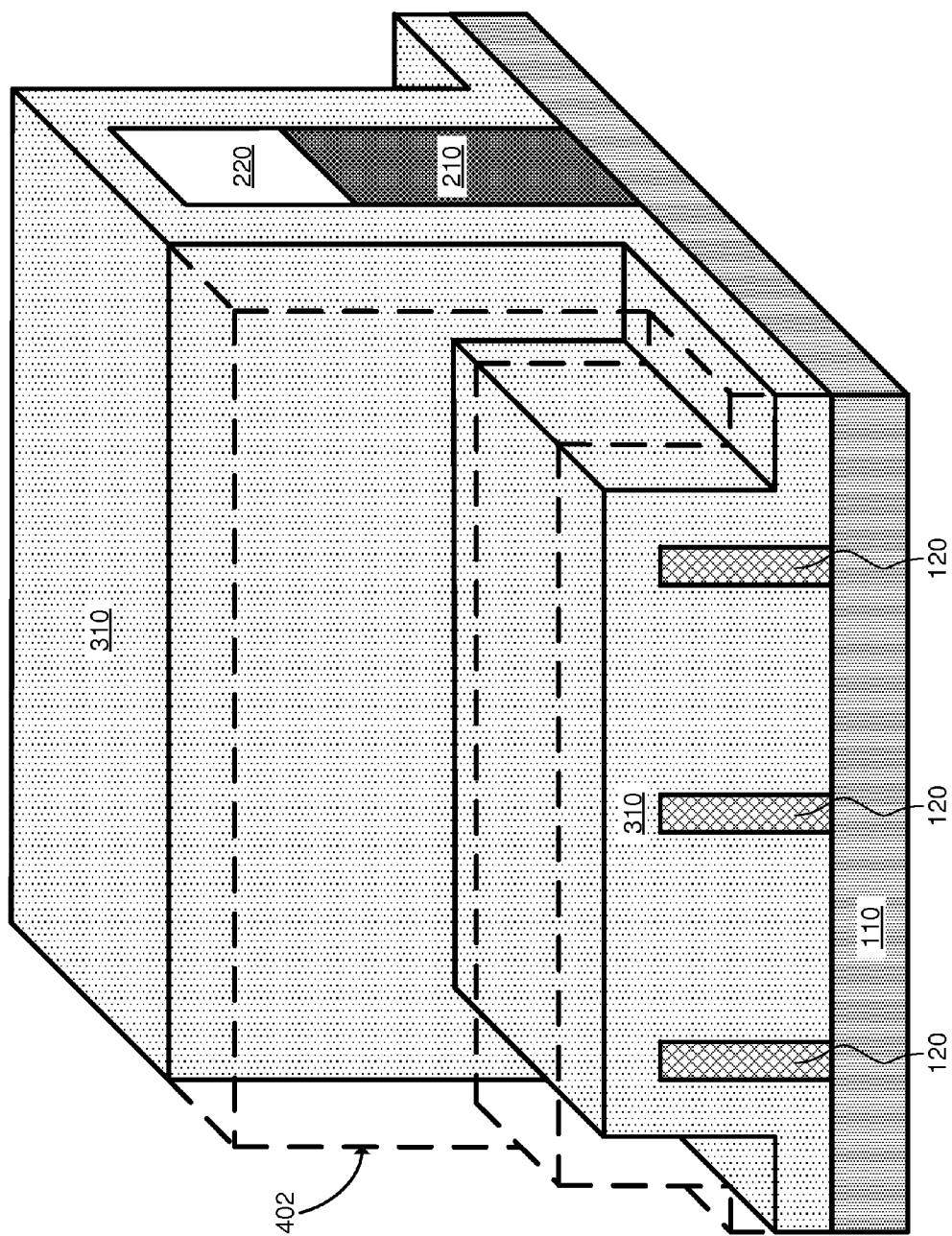
FIGS. 4A-4B are isometric views illustrating removing a first portion of the conformal spacer layer, according to an embodiment of the present invention.
Figure 4B:
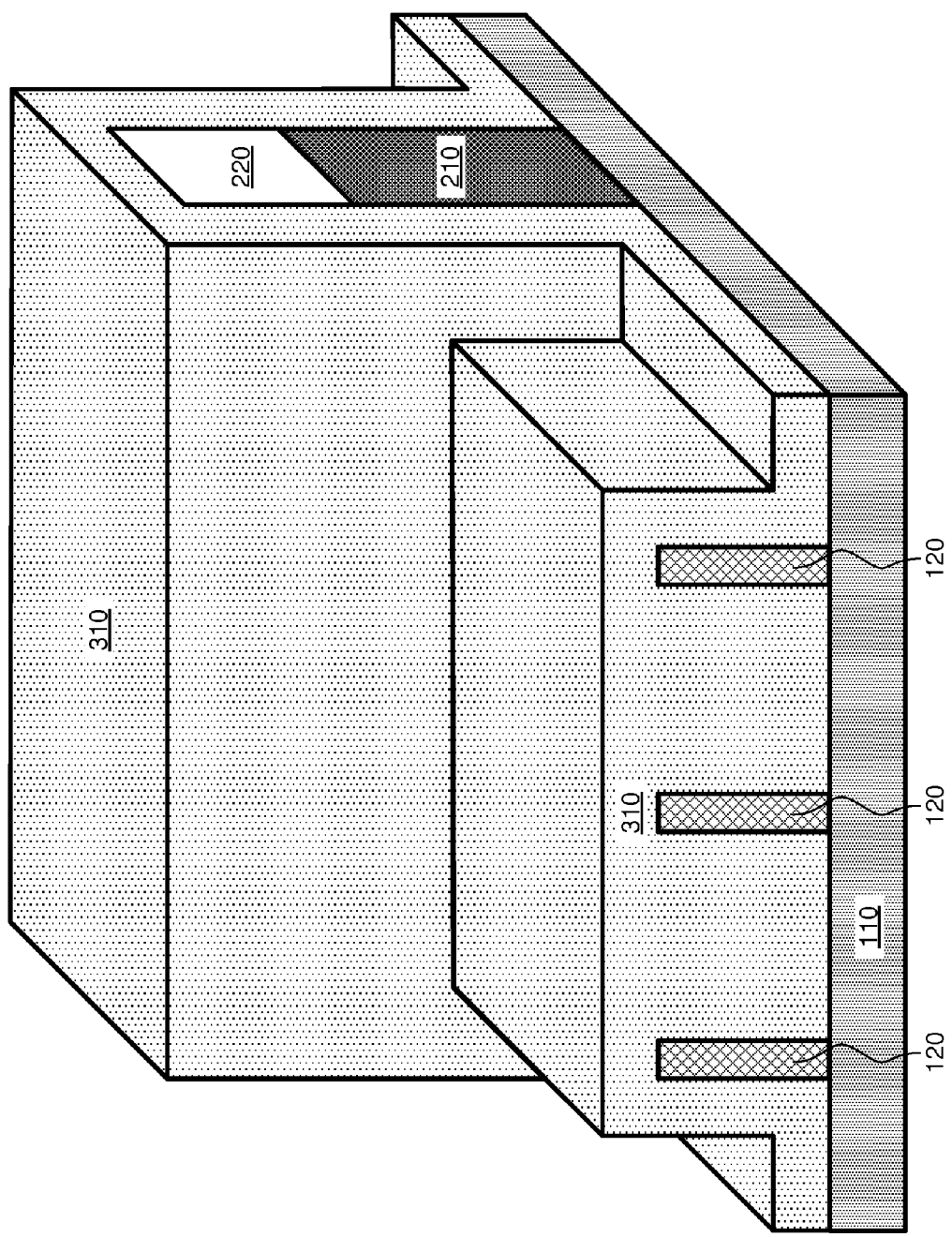

Referring to FIGS. 4A-4B, in an embodiment, a first portion 402 of the conformal spacer layer 310 may be removed so that the conformal spacer layer 310 remains on the sidewalls of the gate 210 at a desired thickness of a subsequently formed sidewall spacer (described below in conjunction with FIG. 5). In a preferred embodiment, the first portion 402 of the conformal spacer layer 310 may be removed using an isotropic etch. The isotropic etch may reduce a thickness of spacer material above a top portion of the fins 120 but may not remove material between the fins 120. It should be noted that although the first portion 402 is shown on one side of the gate 210, embodiments are considered in which a similar portion is removed from the opposing side of the gate 210 as well.

Figure 5A:
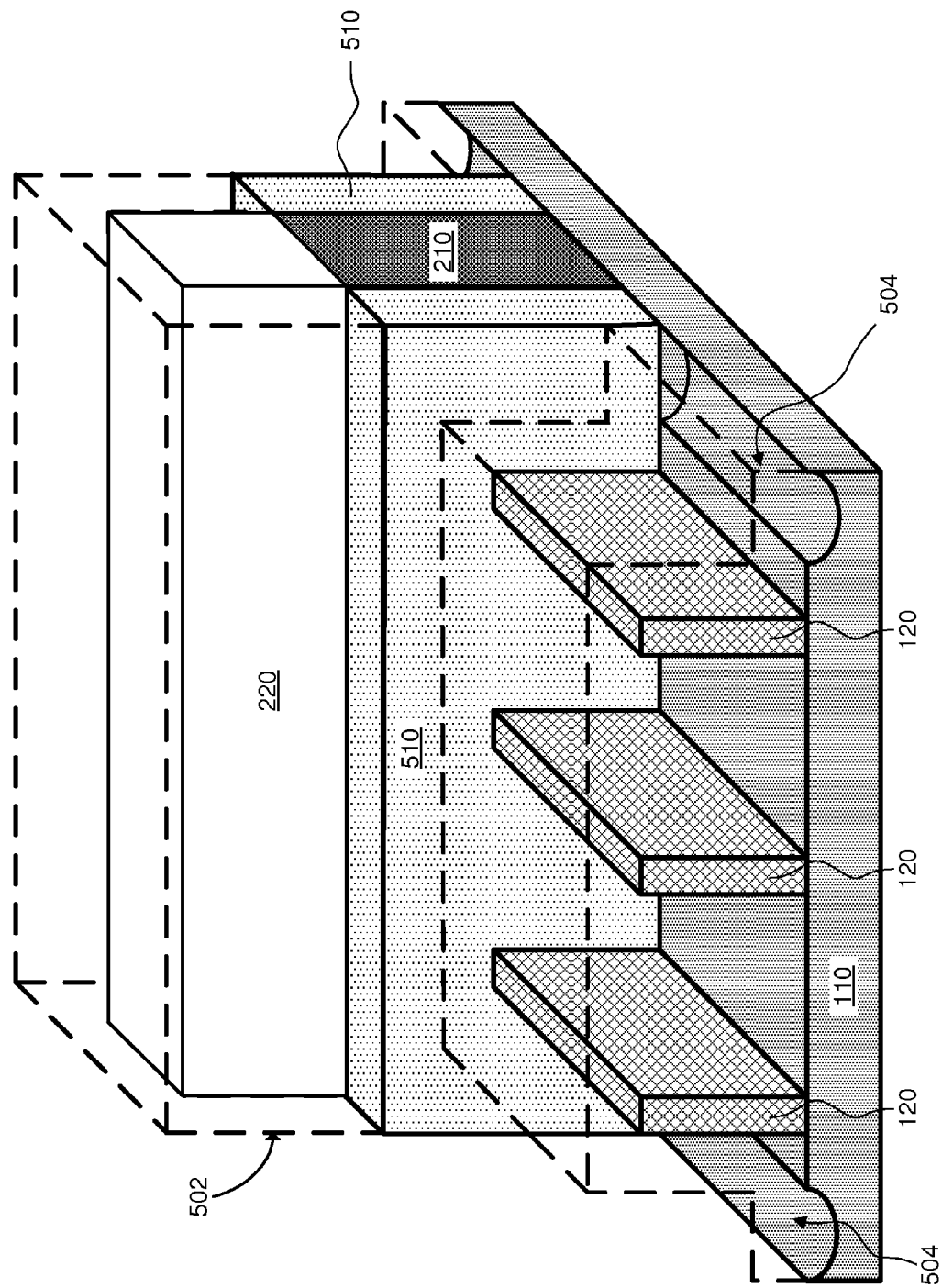
FIGS. 5A-5C are isometric views illustrating removing a second portion of the conformal spacer layer from between the plurality of fins, according to an embodiment of the present invention.
Figure 5B:
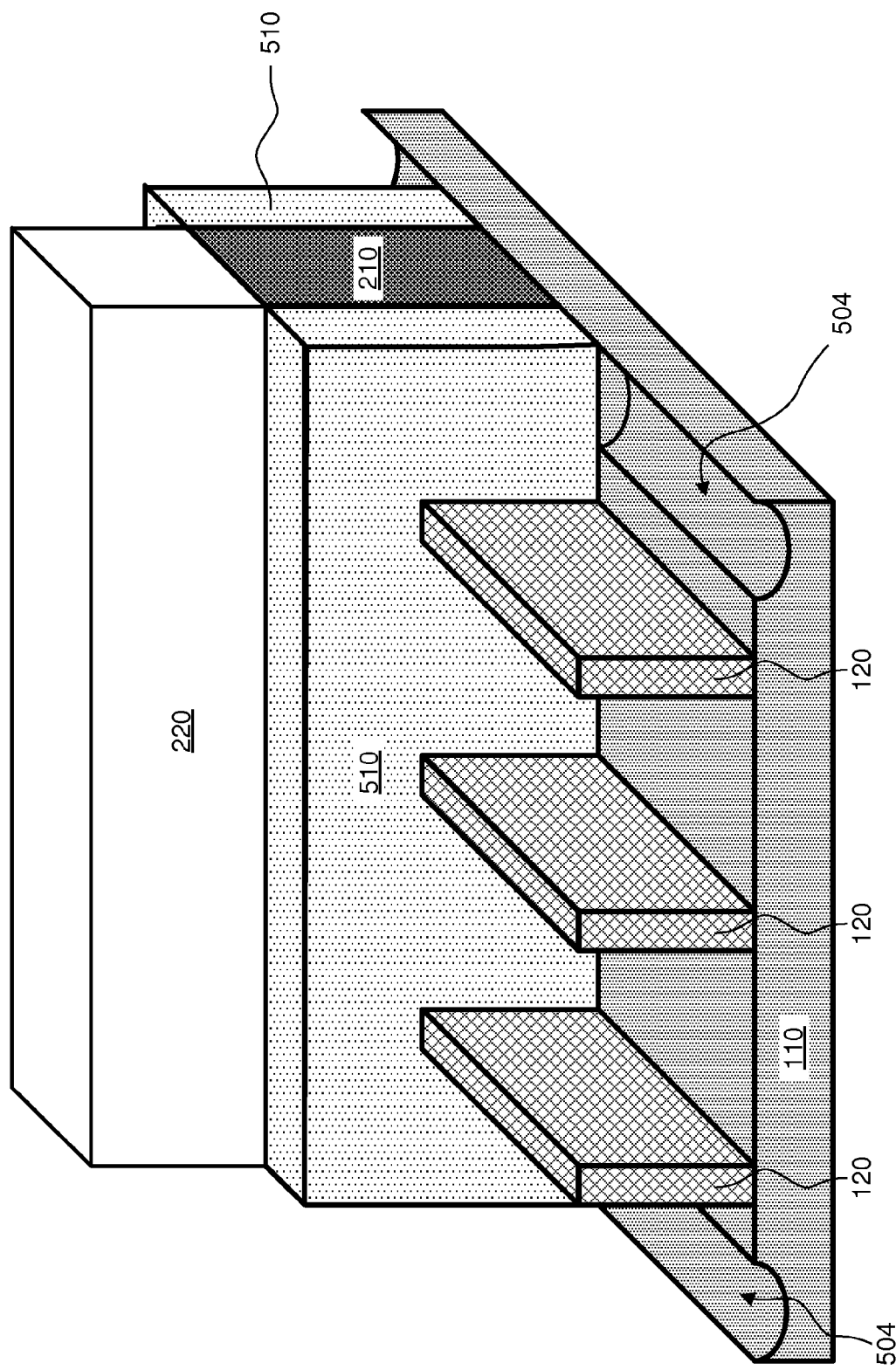
Figure 5C:
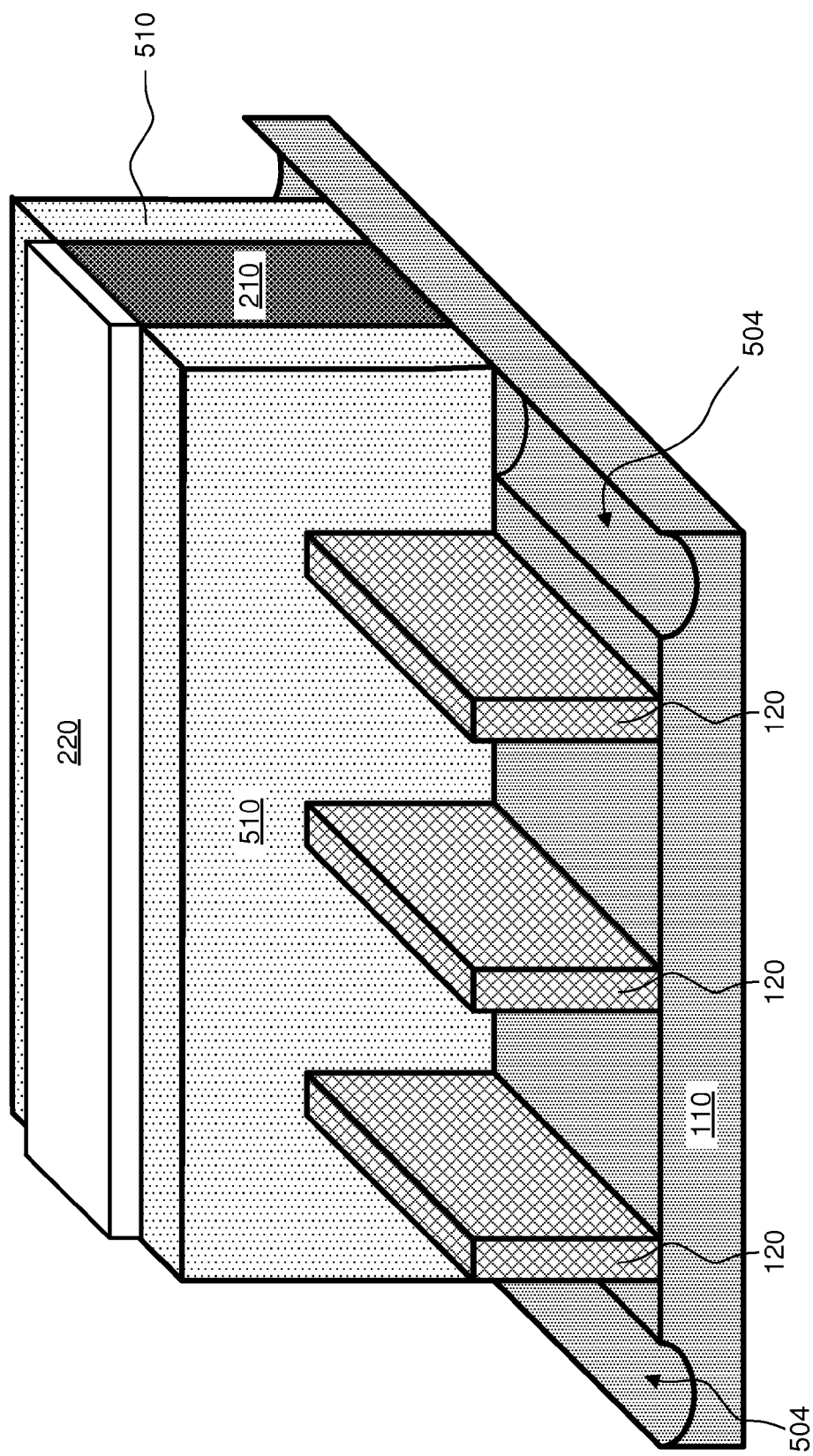

Referring to FIG. 5A-5C, a second portion 502 of the conformal spacer layer 310 (FIG. 4) may be removed to form a spacer 510 that remains on the sidewalls of the gate 210. In an embodiment, the second portion 502 of the conformal spacer layer 310 may be removed using an anisotropic etching process.

Specifically, the second portion 502 of the conformal spacer layer 310 may be removed from around the fins 120 and from around the hardmask 220. Since an anisotropic etch is directional, the second portion 502 of the conformal spacer layer 310 may be removed beginning at a top of the conformal spacer layer 310 and then may be continued uniformly downward until no spacer material remains around the fins 120 and no spacer material remains around the hardmask 220. In one embodiment, the fins 120 and the hardmask 220 may have the same height, which may enable removal of spacer material around the fins 120 down to the substrate 110 and removal of spacer material around the hardmask 220 down to the spacer 510 to be completed at same time. The second portion 502 of the conformal spacer layer 310 may be removed using a conventional anisotropic etching process known in the art, such as, for example, timed reactive ion etching (RIE). It should be noted that although the second portion 502 is shown on one side of the gate 210, embodiments are considered in which a similar portion is removed from the opposing side of the gate 210 as well.

In an embodiment, the anisotropic etch may cause a substrate groove 504 in a portion of an upper surface of the substrate 110 adjacent to and outside the fins 120. The substrate groove 504 may be formed because, although the conformal spacer layer 310 may be thick enough above and in between the fins 120 to protect a portion of the upper surface of the substrate 110 between the fins 120, it may not be has thick over the substrate 110 outside and adjacent to the fins 120. When the anisotropic etch is performed to remove the second portion 502, the thinner portion of the conformal spacer layer 310 outside the fins 120 may be completely removed faster than the portion of the conformal spacer layer 310 above and between the fins 120. Since the portion of the conformal spacer layer 310 between the fins 120 may need to be completely removed, the anisotropic etch may continue even after the thinner portion of the conformal spacer layer 310 outside the fins 120 is completely removed. Accordingly, without any protection, the portion of the substrate 110 adjacent to the fins may be damaged during the anisotropic etch, causing the substrate groove 504. However, because the portion of the substrate 110 between the fins 120 may be shielded by the thicker portion of the conformal spacer layer 310, little to no gouging may occur in the portion of the substrate 110 between the fins 120.

In some embodiments, as illustrated in FIG. 5B, the conformal spacer layer 310 and the hardmask 220 may be comprised of different materials, and the second portion 502 of the conformal spacer layer 310 may be removed selective to the hardmask 220. In other embodiments, as illustrated in FIG. 5C, the conformal spacer layer 310 and the hardmask 220 may be comprised of similar materials, and the anisotropic etch may result in partial or complete removal of the hardmask 220. In a preferred embodiment, the hardmask 220 may be completely removed along with the second portion 520 of the conformal spacer layer 310.

Figure 6:
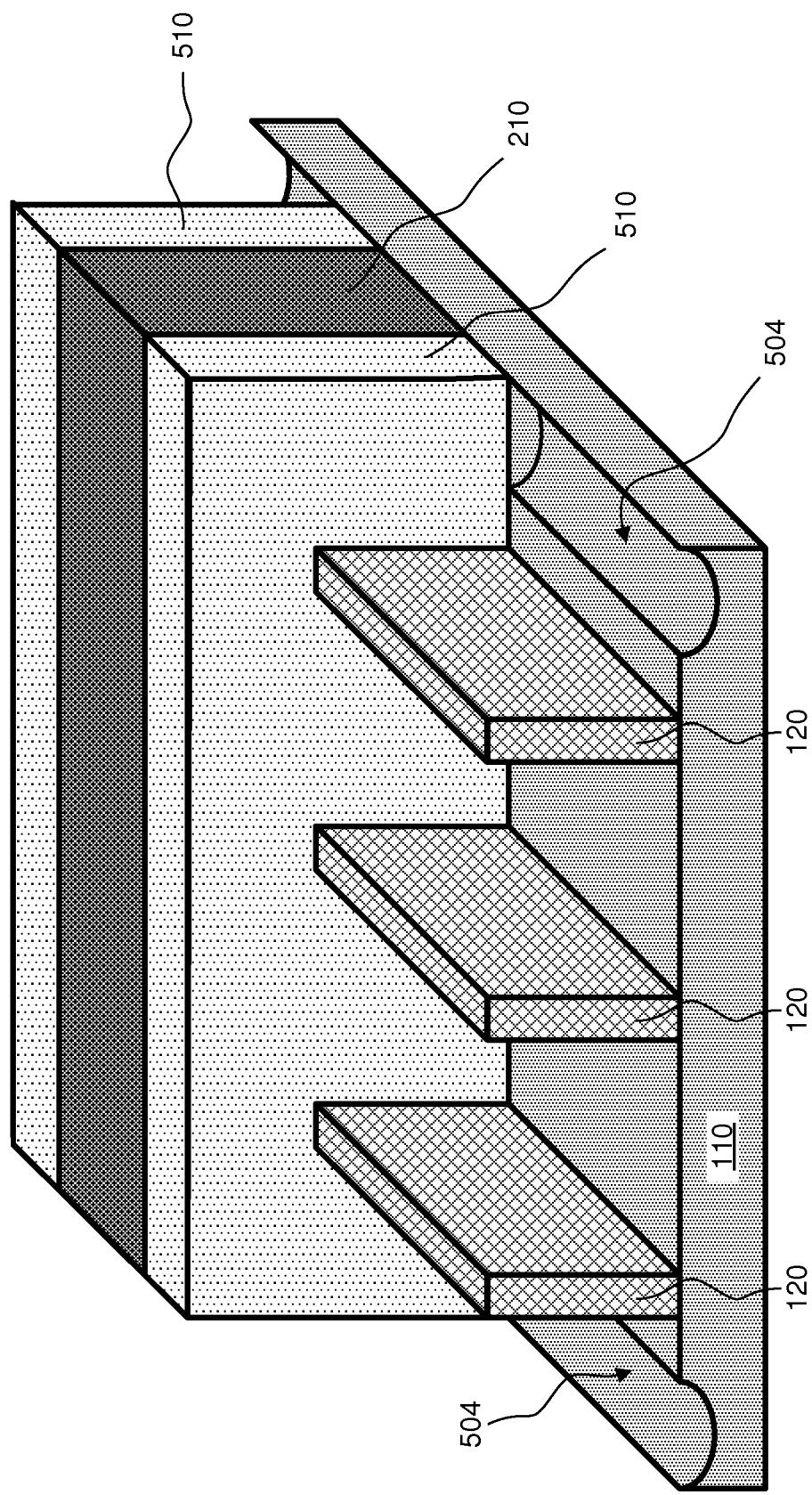
FIG. 6 is an isometric view illustrating removing a hardmask, according to an embodiment of the present invention.

Referring to FIG. 6, the hardmask 220 (FIGS. 5A and 5C) may be removed from the gate 210. In an embodiment, described above with reference to FIGS. 5A and 5C, a portion of hardmask 220 may remain after the spacer 510 is formed. The remaining portion of the hardmask 220 may be removed, selective to the spacer 510, the gate 210, the fins 120, and the substrate 110 using a conventional masking and etching process known in the art, such as, for example, timed RIE.

The present invention may enable the formation of a gate spacer without resulting in the negative effects of substrate gouging between the fins or residual spacer material left on the fins that may result from conventional fabrication techniques. In some embodiments, a conformal spacer layer may cover a plurality of fins and a gate. The conformal spacer may be as have a thickness above the upper surface of the fins that is at least one-half of the distance between the fins. This may ensure that the space between the fins is filled (i.e.

pinched off") and the underlying substrate is protected during subsequent etching. An isotropic etch may be used to adjust the thickness of exposed surfaces of the conformal spacer layer to a target thickness without removing the conformal spacer layer from between the fins. An anisotropic etch may then be used to remove a portion of the conformal spacer layer from top to bottom, leaving only a spacer adjacent to a gate. Since a portion of the conformal spacer layer covers a substrate between the fins during the anisotropic etch, little to no gouging may result in the substrate between the fins. Thus, the substrate between the fins remains substantially flush with a bottom surface of the fins. Since an anisotropic etch is used to remove the conformal spacer layer, little to no residual spacer material (e.g. no spacer foot) may remain on the fins. Thus, once a gate spacer may be formed, spacer material may only remain on a sidewall of the gate and around only a portion of the fins closest to the gate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of reducing substrate gouging between fins of a fin field effect transistor (finFET) during fabrication comprising:
    forming a spacer layer on an upper surface of a substrate and around a gate and the fins, wherein the spacer layer has a thickness above an upper surface of the fins that is at least one-half of a distance between the fins, wherein forming the spacer layer is performed using liquid source misted chemical deposition; and
    removing a portion of the spacer layer using a timed reactive ion etch anisotropic etch, wherein a portion of the spacer layer remains on sidewalls of the gate as a gate spacer, and wherein the upper surface of the substrate between the fins remains substantially flush with a bottom surface of the fins, and wherein a substrate groove is formed in a portion of the upper surface of the substrate adjacent to, and outside of the fins, and wherein the substrate groove abuts the spacer layer.

2. The method of claim 1, wherein the forming the spacer layer on the upper surface of the substrate and around the gate and the fins comprises depositing a conformal layer of dielectric material using a thin film deposition method.

3. The method of claim 1, wherein the forming the spacer layer on the upper surface of the substrate and around the gate and the fins comprises completely filling a region between the fins with spacer material.

4. The method of claim 1, further comprising forming a hardmask on the gate.

5. The method of claim 4, wherein the hardmask comprises silicon nitride.

6. The method of claim 4, further comprising removing the hardmask using the anisotropic etch.

7. The method of claim 4, further comprising removing the hardmask using an additional etching step.

8. The method of claim 1, wherein the gate spacer is in contact with a portion of the fins closest to the gate, a remaining portion of the fins free of the spacer layer.

9. A method comprising:
    forming fins on an upper surface of a substrate;
    forming a gate around the fins, wherein the gate is orthogonal to a length of the fins;
    forming a conformal spacer layer on the upper surface of the substrate and around the fins and the gate, the conformal spacer layer having a thickness above an upper surface of the fins that is at least one-half of a distance between the fins, wherein forming the spacer layer is performed using liquid source misted chemical deposition; and
    removing a portion of the spacer layer using a timed reactive ion etch anisotropic etch, wherein a portion of the conformal spacer layer remains on sidewalls of the gate as a gate spacer, and wherein the upper surface of the substrate between the fins remains substantially flush with a bottom surface of the fins, and wherein a substrate groove is formed in a portion of the upper surface of the substrate adjacent to, and outside of the fins such that the substrate groove abuts the spacer layer.

10. The method of claim 9, wherein the forming the conformal spacer layer on the upper surface of the substrate and around the gate and the fins comprises depositing a layer of dielectric material using a thin film deposition method.

11. The method of claim 9, wherein the forming the conformal spacer layer on the upper surface of the substrate and around the gate and the fins comprises completely filling in a region between the fins with spacer material.

12. The method of claim 9, further comprising forming a hardmask on the gate.

13. The method of claim 12, further comprising removing the hardmask using the anisotropic etch.

14. The method of claim 12, further comprising removing the hardmask using an additional etching step.

15. The method of claim 9, wherein the gate spacer is in contact with a portion of the fins closest to the gate, a remaining portion of the fins free of the conformal spacer layer.

* * * * *